(12) United States Patent
Sasaki

(10) Patent No.: US 8,094,422 B2
(45) Date of Patent: Jan. 10, 2012

(54) INTEGRATED CIRCUIT

(75) Inventor: Nagisa Sasaki, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 254 days.

(21) Appl. No.: 12/437,408

(22) Filed: May 7, 2009

(65) Prior Publication Data

US 2009/0303645 A1 Dec. 10, 2009

(30) Foreign Application Priority Data

Jun. 6, 2008 (JP) ................................ 2008-149200

(51) Int. Cl.
*H02H 9/00* (2006.01)
(52) U.S. Cl. ........................................................ 361/56
(58) Field of Classification Search .................. 361/56
See application file for complete search history.

(56) References Cited

U.S. PATENT DOCUMENTS

| | | | |
|---|---|---|---|
| 6,327,125 B1 * | 12/2001 | Colclaser et al. | 361/56 |
| 6,385,021 B1 * | 5/2002 | Takeda et al. | 361/56 |
| 2003/0117206 A1 | 6/2003 | Ohnakado | |
| 2007/0215948 A1 * | 9/2007 | Yang | 257/355 |
| 2008/0174925 A1 * | 7/2008 | Woo et al. | 361/56 |

FOREIGN PATENT DOCUMENTS

| JP | 2003-197754 | 7/2003 |
|---|---|---|
| JP | 2007-311813 | 11/2007 |

* cited by examiner

*Primary Examiner* — Ronald W Leja
(74) *Attorney, Agent, or Firm* — McDermott Will & Emery LLP

(57) ABSTRACT

An integrated circuit aims to decrease a parasitic resistance between an input protection circuit cell and a power supply cell including a clamp circuit, restrain a size of a diode from increasing beyond ESD robustness of the diode itself in order to compensate for a decrease in the ESD robustness, and prevent high-frequency signal power from decreasing due to a large capacitance component from a diode in an input protection circuit and a parasitic resistance component from a series resistor. The input protection circuit cell includes: an input terminal coupled to a signal pin; an output terminal coupled to not only a high-frequency circuit but also the input terminal and a node; a diode that is provided between the node and VDD and makes an electric current flow from the node to VDD; another diode that is provided between the node and GND and makes an electric current flow from GND to the node; and a clamp circuit coupled between VDD and GND parallel to the diodes.

3 Claims, 10 Drawing Sheets

INPUT PROTECTION CIRCUIT CELL

POWER SUPPLY CELL

INTEGRATED CIRCUIT

CROSS-REFERENCE TO RELATED APPLICATIONS

The disclosure of Japanese Patent Application No. 2008-149200 filed on Jun. 6, 2008 including the specification, drawings and abstract is incorporated herein by reference in its entirety.

BACKGROUND OF THE INVENTION

The present invention relates to an integrated circuit including an input protection circuit cell.

FIG. 1 shows an input protection circuit cell 70 and a power supply cell 71 according to a conventional technology. To ensure ESD robustness, the input protection circuit cell 70 according to a conventional technology uses diodes 1 and 2. The diodes each have a capacitance of several picofarads and are reversely coupled between a power supply voltage (VDD) and a signal input line and between the signal input line and a ground (GND). A series resistor 40 is serially coupled to the signal input line. In a power supply cell 51, as shown in FIG. 1, an input circuit 43 and a clamp circuit 4 are parallel coupled between VDD and GND.

FIG. 2 shows in more detail the inside of the input circuit 43 and the clamp circuit 4 according to the conventional technology. A diode 44 is coupled between input and output sides of the input circuit 43. The clamp circuit 4 includes a resistor 11 and a capacitor 12 that are serially coupled between VDD and GND. The clamp circuit 4 also includes an NMOS transistor 10 that uses the source terminal for the power supply voltage and the drain terminal for the ground. The clamp circuit 4 further includes an inverter 13 that has an input section coupled to a node between the resistor 11 and the capacitor 12 and an output section coupled to the gate terminal of the NMOS transistor 10.

FIG. 3 shows an example layout of the input protection circuit cell 70 and the power supply cell 71.

FIG. 4 shows a chip layout of an integrated circuit 80 mounted with an input protection circuit cell and a power supply cell according to a conventional technology. As shown in FIG. 4, the layout is configured to include input protection circuit cells 50 and 51 and power supply cells 26 and 29. The input protection circuit cells 50 and 51 each are equivalent to the input protection circuit cell 70. The power supply cells 26 and 29 each are equivalent to the power supply cell 71. The power supply cells 26 and 29 include clamp circuits 26a and 29a. In the overall chip configuration, as shown in FIG. 4, the input protection circuit cells 50 and 51 are located adjacently to an RF input pad. The power supply cells 26 and 29 including the clamp circuit 4 are located adjacent to a VDD pad 20 or a GND pad 25.

Patent Documents 1 and 2 describe the methods of decreasing parasitic capacitance in an ESD protection circuit.

Patent Document 1: Japanese Unexamined Patent Publication No. 2007-311813

Patent Document 2: Japanese Unexamined Patent Publication No.

SUMMARY OF THE INVENTION

There has been a problem that a high-frequency signal supplied to an RF input pad attenuates due to a large input capacitance from the diodes 1 and 2 of several picofarads and parasitic resistance components from the series resistor 40.

The following describes why the diode capacitance increases. The input protection circuit cells 50 and 51 are routed to the power supply cells 26 and 29 via wiring metal such as discharge paths 100 and 101 in FIG. 4. The discharge path 100 (discharge path 9 in FIG. 1) provides the shortest distance from the pulse input to the GND. The discharge path 101 includes the power supply cell 26 adjacent to the VDD pad. A clamp circuit 26a of the power supply cell 26 is distant from the RF input pad and the GND pad. The parasitic resistance 41 in FIG. 1 cannot ensure a low impedance, making the ESD robustness insufficient.

To solve this problem, the diode needs to decrease the operating voltage when an ESD is applied. For this reason, the diode requires a larger size than is used for maintaining the specified ESD robustness. The diode capacitance increases accordingly.

For example, let us consider that a human body model electrostatic discharge (HBM/ESD) test is conducted on the circuit in FIG. 1 to apply a positive surge voltage of 2000 V to the RF input pad with reference to the GND. In this case, a peak current approximates to 1.33 A. Let us suppose that the clamp circuit 4 operates on Vc (V) and that the diode 1 has a size large enough to satisfy an HBM withstand voltage of 2000 V or higher and operates on Vd (V). In this case, the voltage drops approximately by 1.33 Rp (V) when the parasitic resistance 41 is Rp (O). In total, the RF input pad is supplied with (Vc+Vd+1.33 Rp) voltages.

A circuit to be protected is assumed to be supplied with a degradation start voltage Vic set to 11 V. The degradation start voltage Vic is expressed as follows: Vic (=11 V)<Vc+Vd+1.33 Rp (=5+2.3+4=11.3 V), where Vc is set to 5 V, Vd to 2.3 V, and Rp to 3 O. The circuit to be protected is supplied with a voltage higher than or equal to the degradation start voltage. It is impossible to satisfy the condition of the HBM withstand voltage of 2000 V or higher. The diode 1 requires increasing its area so as to keep the operating voltage Vd smaller than or equal to (Vic−Vc−1.33 Rp)=11−5−4=2 V even though the diode 1 itself has the size large enough to ensure the HBM withstand voltage of 2000 V or higher. Since the discharge path causes a high resistance, the series resistor 40 is also needed to protect the internal circuit.

The methods described in Patent Documents 1 and 2 reduce parasitic capacitance in the ESD protection circuit. However, the methods do not decrease the resistance on the discharge path and do not solve the problem due to the high resistance.

The present invention has been made in consideration of the foregoing. It is therefore an object of the present invention to decrease parasitic resistance between an input protection circuit cell and a clamp circuit in an integrated circuit, restrain a diode size from becoming larger than ESD robustness of a diode itself for compensating a decrease in the ESD robustness, and prevent high-frequency signal power from attenuating due to input capacitance components from a diode in an input protection circuit and parasitic resistance components of a series resistor.

An integrated circuit according to an embodiment of the invention includes: a signal pin; an internal circuit including a high-frequency circuit; and an input protection circuit cell that is placed between the signal pin and the internal circuit and performs a protection operation when a signal at the signal pin is applied to the high-frequency circuit. The input protection circuit cell includes: an input terminal coupled to the signal pin; an output terminal that is coupled to the high-frequency circuit and to the input terminal via a coupling node; a first diode that is provided between the coupling node and a high-voltage power supply and makes an electric current flow from the coupling node to the high-voltage power supply; and a second diode that is provided between the coupling node and a low-voltage power supply and makes an electric current flow from the low-voltage power supply to the coupling node. The input protection circuit cell further includes: a clamp circuit that is coupled parallel to the first and second diodes between the high-voltage power supply and the low-voltage power supply.

The integrated circuit according to the embodiment of the invention configures the clamp circuit in the input protection circuit cell. This makes it possible to provide more discharge paths for an ESD pulse current than conventional arts and reduce the impedance. The reduction in the impedance for the discharge path can minimize the size of the diode for the input protection circuit so that the ESD robustness can be ensured. It is possible to reduce a loss in the high-frequency signal while ensuring the ESD robustness. The reduction in the impedance for the discharge path can eliminate a serially coupled resistor element and reduce a loss in the high-frequency signal.

DETAILED DESCRIPTION OF THE PREFERRED EMBODIMENTS

The following describes the invention with reference to the accompanying drawings showing embodiments.

<Configuration>

Figure 5:
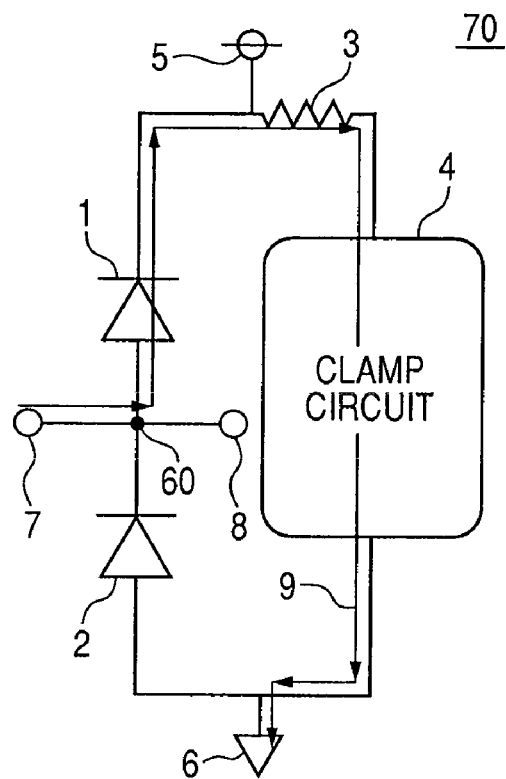
FIG. 5 shows a circuit of an input protection circuit cell according to the invention.

FIG. 5 shows a circuit diagram of the input protection circuit cell according to an embodiment of the invention.

An input protection circuit cell 70 is located between a signal pin of a mounted integrated circuit and an internal circuit including a high-frequency circuit. The input protection circuit cell 70 includes an input terminal 7 and an output terminal 8. The input terminal 7 is coupled to the signal pin. The output terminal 8 is coupled to the high-frequency circuit as well as the input terminal 7 and a node (coupling node) 60. A first diode 1 is provided between the node 60 and a high-voltage power supply (VDD) 5 and supplies an electric current from the node 60 to the VDD 5. A second diode 2 is provided between the node 60 and a low-voltage power supply (GND) 6 and supplies an electric current from the GND 6 to the node 60. Further, a clamp circuit 4 is coupled between the VDD 5 and the GND 6 parallel to the diodes 1 and 2. Reference numeral 3 denotes parasitic resistance along the discharge path 9.

Figure 6:
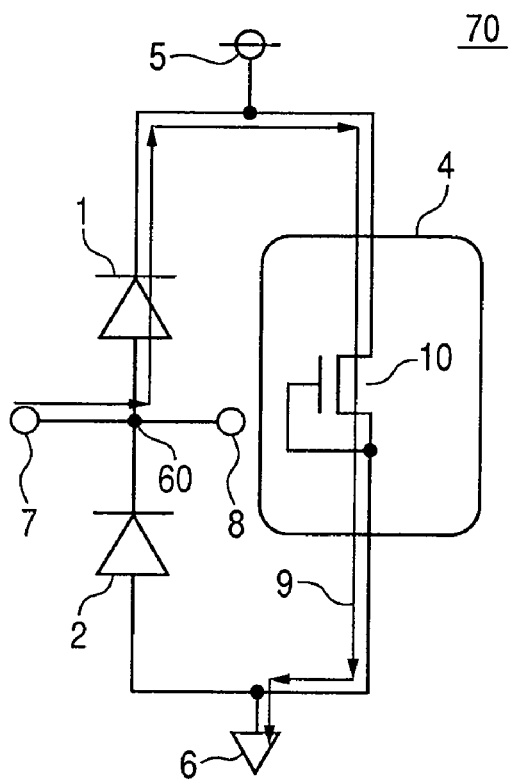
FIG. 6 shows a circuit of the input protection circuit cell according to the invention.

FIG. 6 shows a circuit diagram of the input protection circuit cell 70 including the clamp circuit 4 whose inside is revealed. The clamp circuit 4 includes an NMOS transistor 10 having a source terminal coupled to the VDD 5 and gate and drain terminals coupled to the GND 6.

Figure 7:
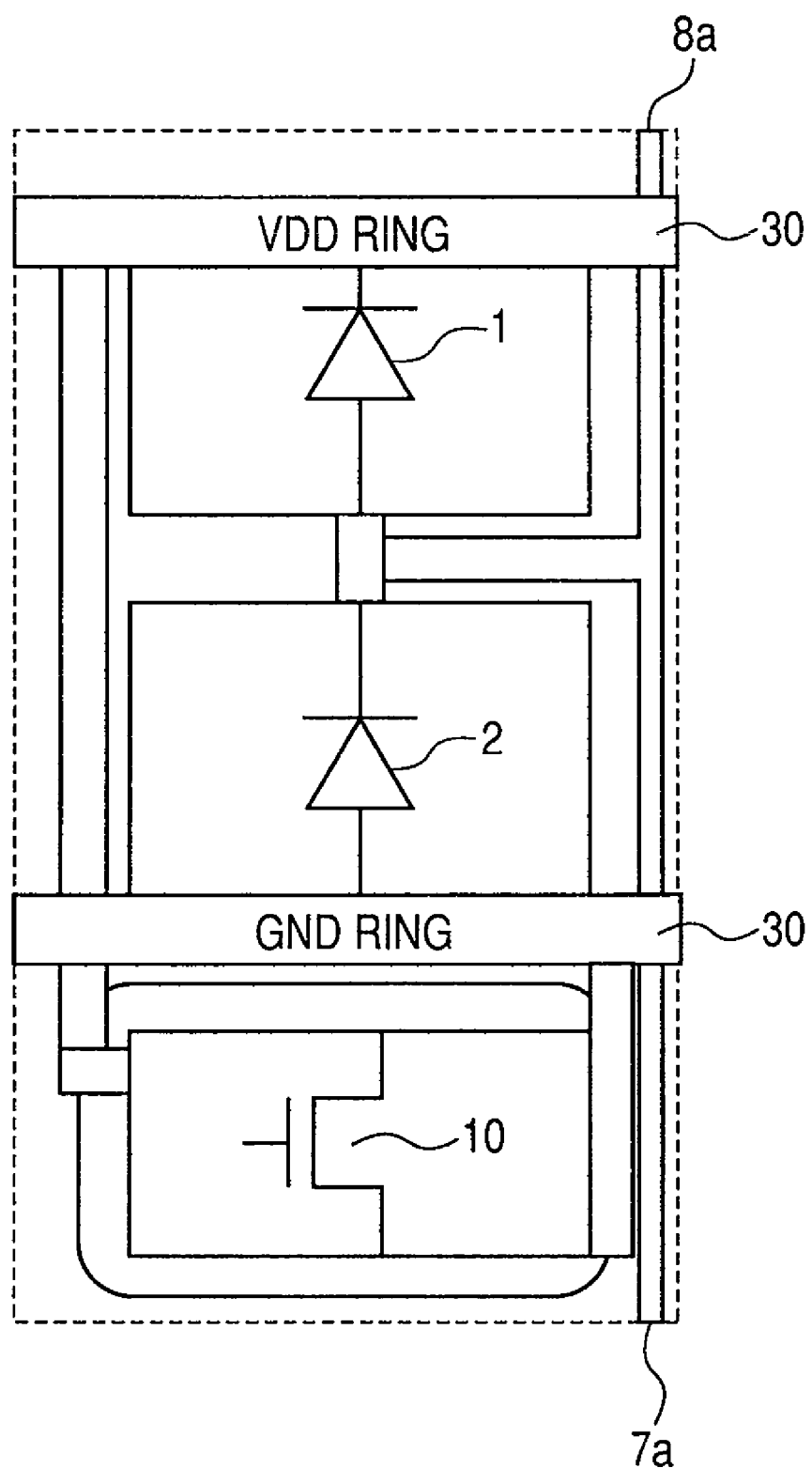
FIG. 7 shows a layout of the input protection circuit cell according to the invention.

FIG. 7 illustrates a layout example of the input protection circuit cell 70 shown in FIG. 6. The input protection circuit cell 70 includes a VDD ring 30 (first wiring) and a GND ring 5b (second wiring). The VDD ring 30 supplies VDD. The GND ring 5b is placed parallel to the VDD ring 30 and supplies GND. The input protection circuit cell 70 further includes diodes 1 and 2. The diode 1 is placed between the VDD ring 30 and GND ring 5b near the VDD ring 30. The diode 2 is placed between the VDD ring 30 and GND ring 5b near the GND ring 5b. The input protection circuit cell 70 furthermore includes the NMOS transistor 10, an output terminal 8a, and an input terminal 7a. The NMOS transistor 10 is placed outside the GND ring 5b. The output terminal 8a is placed outside the VDD ring 30. The input terminal 7a is placed outside the NMOS transistor 10.

Figure 2:
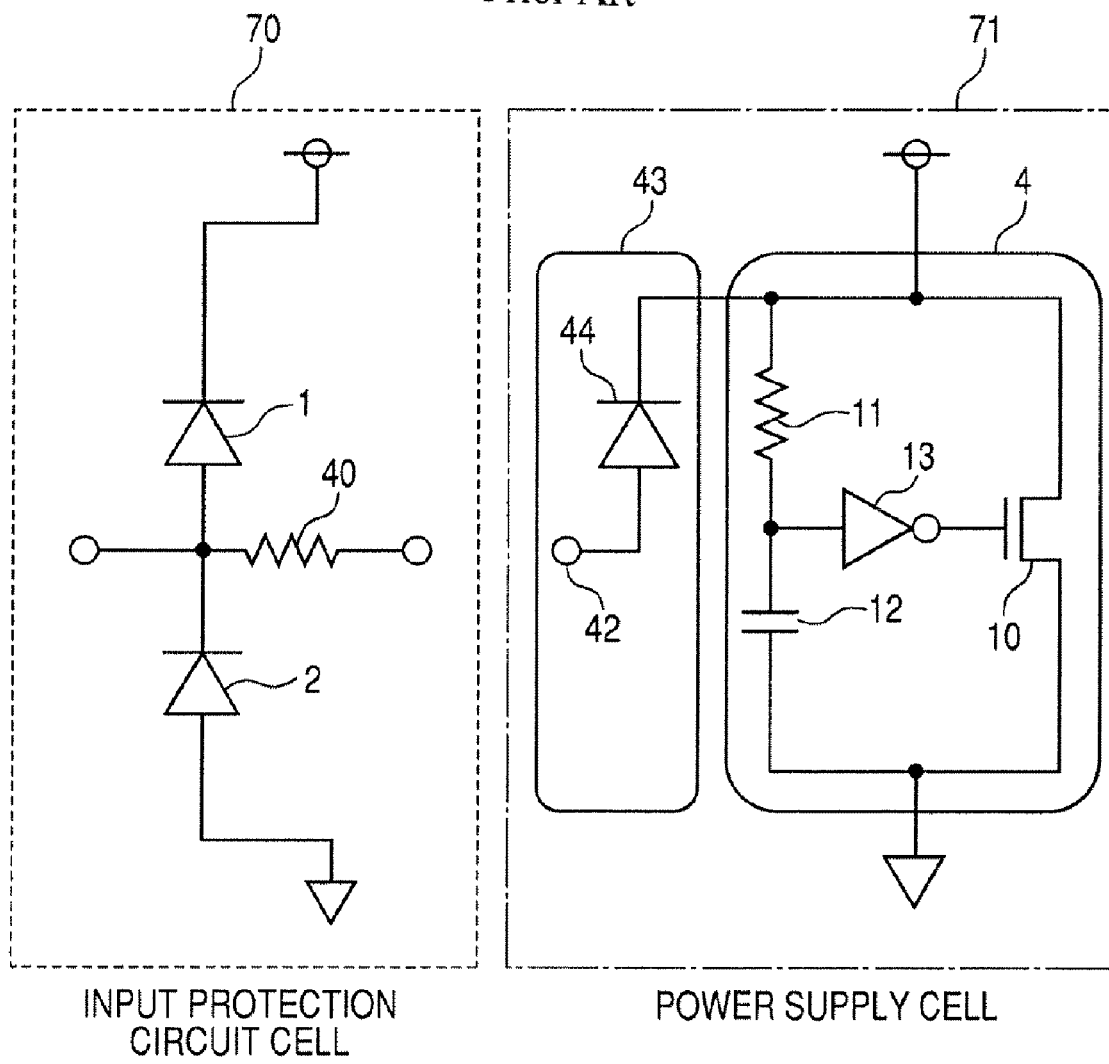
FIG. 2 shows a circuit including an input protection circuit cell and a power supply cell according to a conventional technology.
Figure 3:
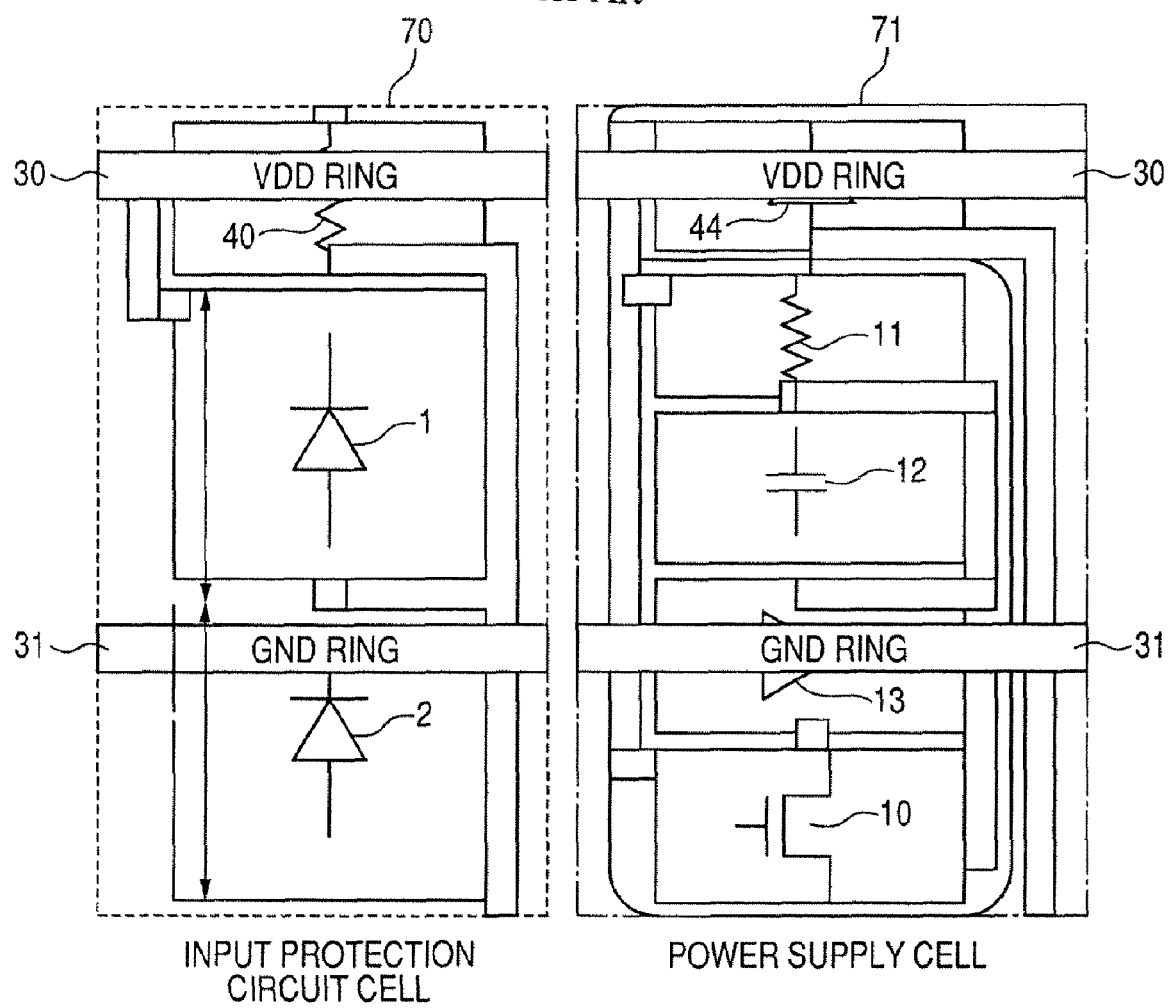
FIG. 3 shows a layout including an input protection circuit cell and a power supply cell according to a conventional technology.
Figure 4:
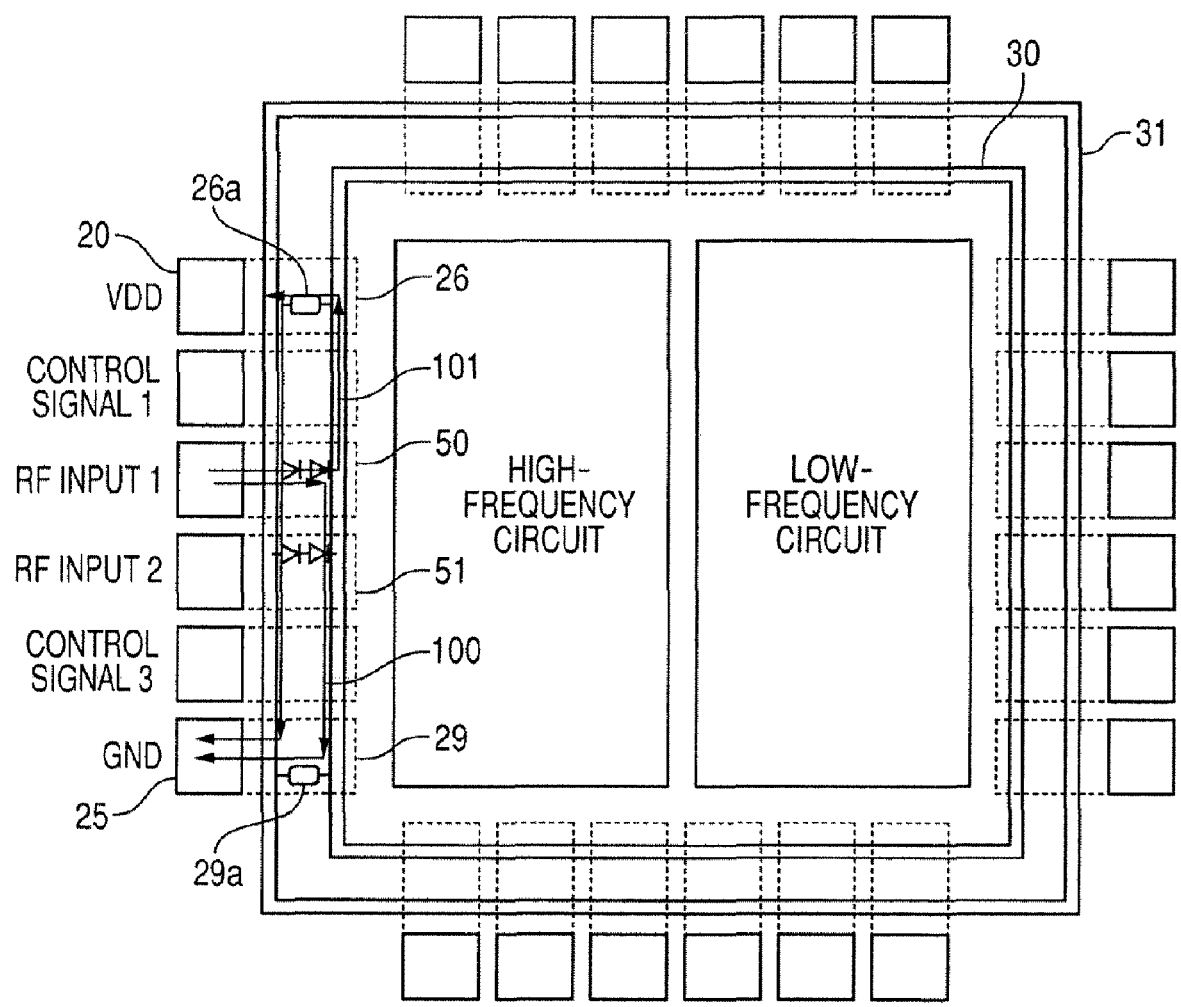
FIG. 4 shows a chip layout according to a conventional technology.

Compared to a conventional technology, the embodiment reduces the size of the diodes 1 and 2 by reducing the impedance of the discharge path to be described later. Since the NMOS transistor 10 is used as a clamp circuit, it is possible to reduce the layout area in comparison with the clamp circuit 4 in FIG. 2 according to the conventional technology. The clamp circuit 4 can be contained in the input protection circuit cell 70. The embodiment eliminates the series resistor 40 that is used for the conventional technology.

Figure 8:
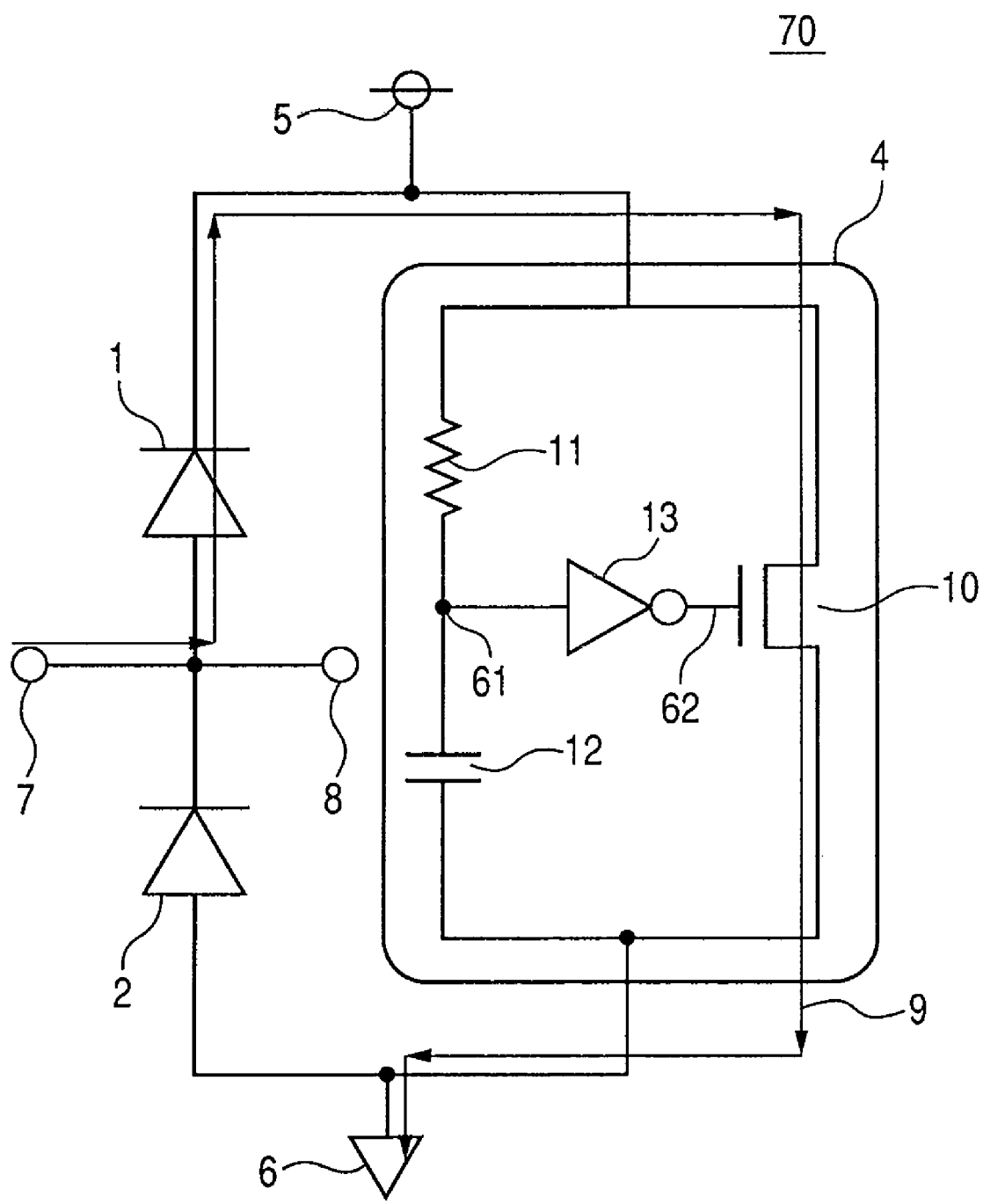
FIG. 8 shows a circuit of the input protection circuit cell according to the invention.

FIG. 8 shows a circuit diagram of the input protection circuit cell 70 including the clamp circuit 4 according to another mode. The clamp circuit 4 includes the resistor 11 and the capacitor 12. The resistor 11 is coupled between the VDD 5 and a node 61 (first node). The capacitor 12 is coupled between the node 61 and the GND 6. The clamp circuit 4 also includes the inverter 13 and the NMOS transistor 10. The inverter 13 is coupled between the node 61 and a node 62 (second node). The inverter has an input side corresponding to the node 61 and an output side corresponding to the node 62. The NMOS transistor 10 has a gate terminal coupled to the node 62, a source terminal coupled to the VDD 5, and a drain terminal coupled to the GND 6.

Figure 9:
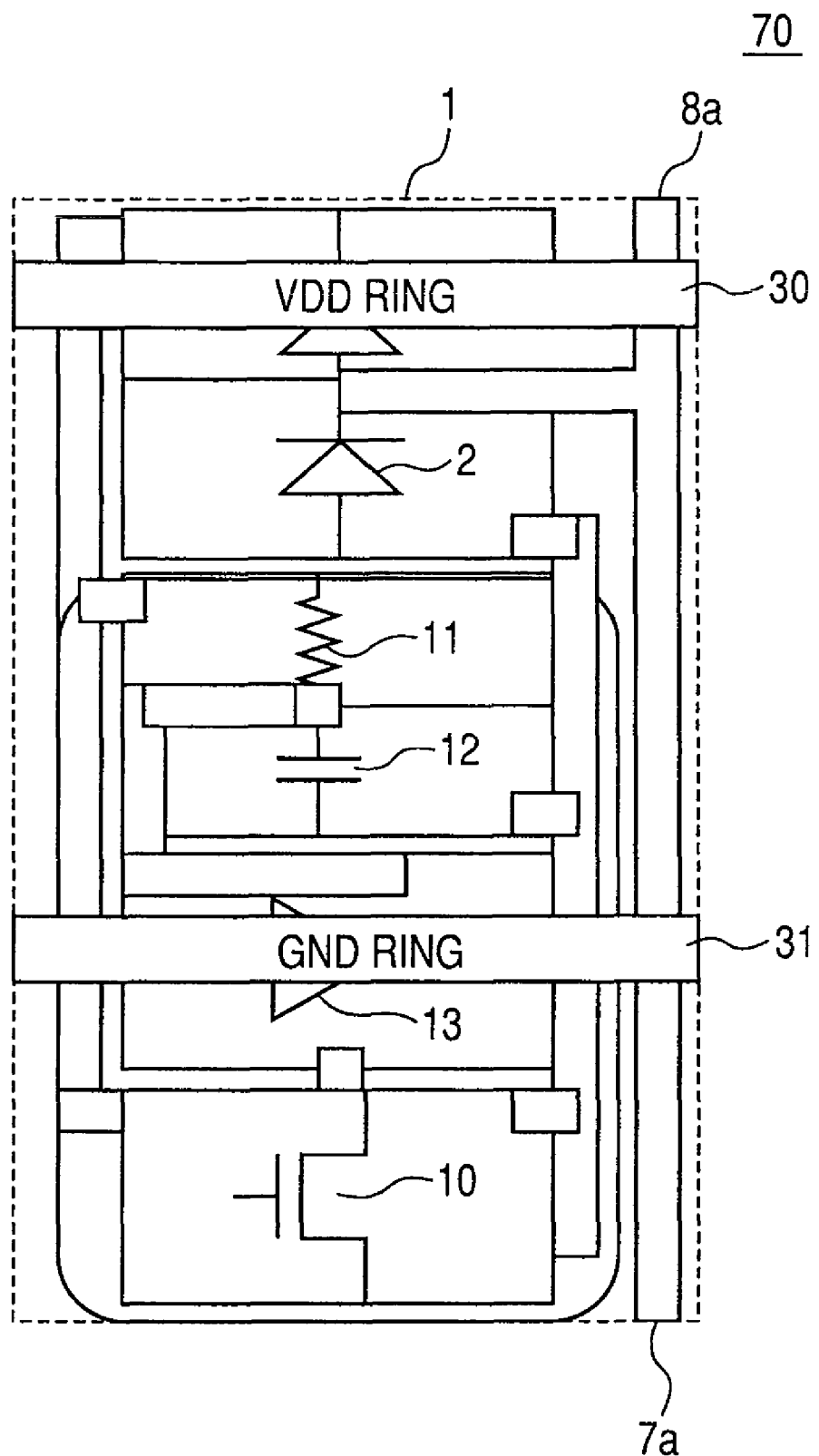
FIG. 9 shows a layout of the input protection circuit cell according to the invention.

FIG. 9 shows a layout example of the input protection circuit cell 70 shown in FIG. 8. The input protection circuit cell 70 includes: the VDD ring 30 that supplies VDD; a GND ring 31 placed parallel to the VDD ring 3 and supplies GND; the diode 1 (first diode) placed under the VDD ring 30; and the diode 2 (second diode) placed between the VDD ring 30 and the GND ring 31 beside the diode 1. The input protection circuit cell 70 further includes: the resistor 11 placed between the VDD ring 30 and the GND ring 31 beside the diode 2; the capacitor 12 placed between the VDD ring 30 and the GND ring 31 beside the resistor 11; the inverter 13 placed under the GND ring 31; the NMOS transistor 10 placed outside the GND ring 31; an output terminal 8a placed outside the VDD ring 30; and an input terminal 7a placed outside the NMOS transistor 10.

Compared to a conventional technology, the embodiment reduces the size of the diodes 1 and 2 by reducing the impedance of the discharge path to be described later. The input protection circuit cell 70 in FIG. 8 uses a clamp circuit equivalent to the clamp circuit 4 in FIG. 2 according to the conventional technology. The circuit design is changed to halve the capacitor 12 and double the resistor 11. The clamp circuit 4 can be contained in the input protection circuit cell 70 by matching the CR time constant and reducing the layout area. The embodiment eliminates the series resistor 40 that is used for the conventional technology.

Figure 1:
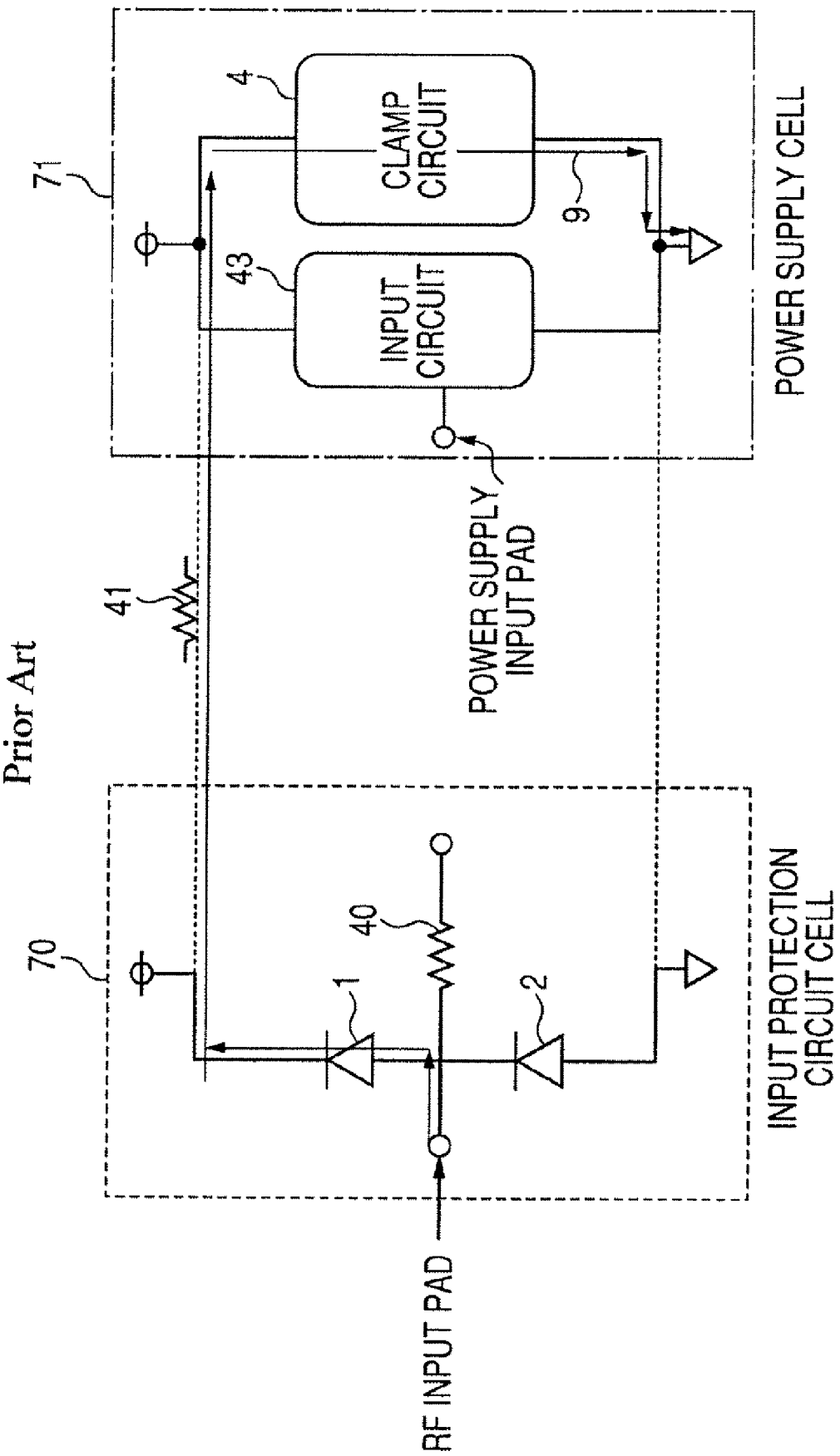
FIG. 1 shows a circuit including an input protection circuit cell and a power supply cell according to a conventional technology.
Figure 10:
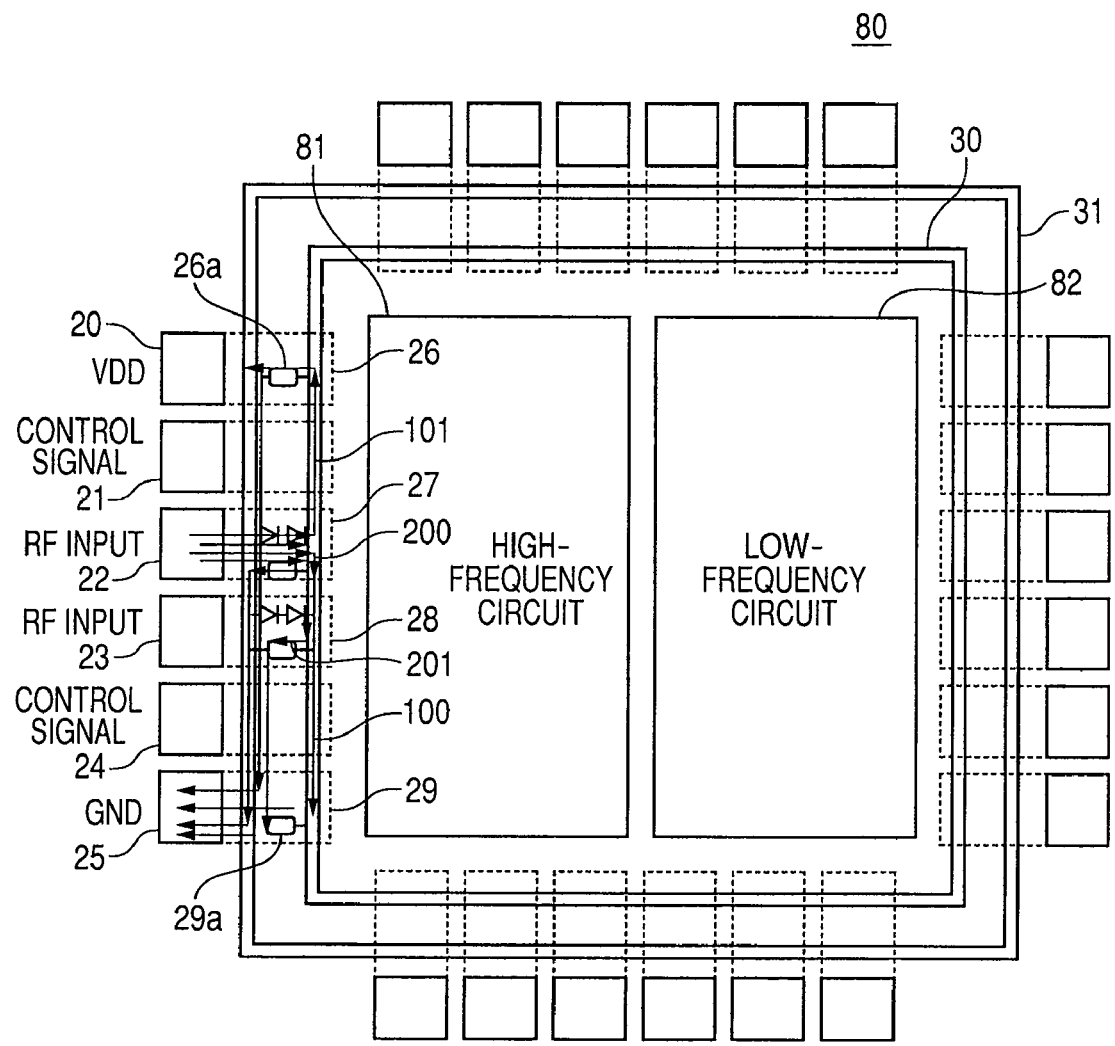
FIG. 10 shows a chip layout according to the invention.

FIG. 10 shows a chip layout of the integrated circuit 80 according to the embodiment. The integrated circuit 80 contains a high-frequency circuit 81 and a low-frequency circuit 82. Near the high-frequency circuit 81, there are provided the VDD pad 20, a control signal pad 21, an RF input pad 22, an RF input pad 23, a control signal pad 24, and the GND pad 25. The VDD pad 20 and the GND pad 25 contain power supply cells 26 and 29 (equivalent to the power supply cell 71 in FIGS. 1 and 2) that further contain clamp circuits 26a and 29a. The RF input pads 22 and 23 contain input protection circuit cells 27 and 28 (equivalent to the input protection circuit cell 70 in FIGS. 1 and 2).

The input protection circuit cells 27 and 28 are placed between the RF input pads 22 and 23 coupled to signal pins of the integrated circuit 80 and the internal circuit containing the high-frequency circuit 81. The input terminal 7 in FIG. 5 is coupled to the RF input pads 22 and 23. The output terminal 8 is coupled to the high-frequency circuit 81.

Figure 11:
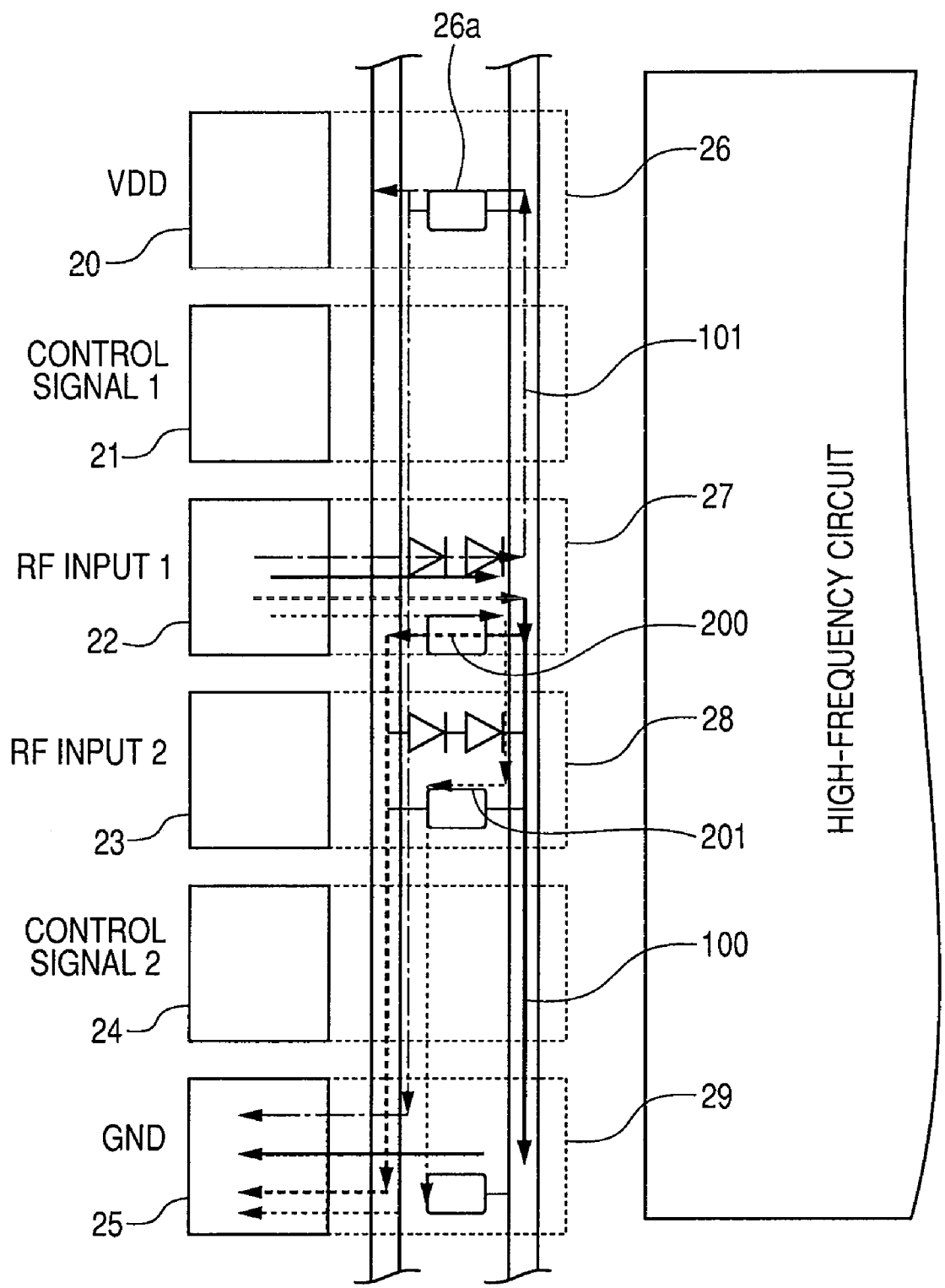
FIG. 11 shows an enlarged part of the chip layout according to the invention.

The VDD ring 30 and the GND ring 31 are wired so as to be common to the entire chip. FIG. 11 shows an enlarged view around the cells in FIG. 10.

<Operations>

The following describes operations. First, clamp circuit operations will be described.

The clamp circuit 4 in FIGS. 6 and 7 uses characteristics of an NMOS transistor that the NMOS transistor causes a parasitic bipolar operation outside a normal operation range. During a normal operation, the NMOS transistor 10 hardly makes an electric current flow because the drain is supplied with a specified voltage. When a surge is applied, the drain is supplied with a large voltage. The NMOS transistor 10 causes a parasitic bipolar operation to makes an electric current flow through the discharge path 9.

During a normal operation, the clamp circuit in FIGS. 8 and 9 allows the inverter 13 to be supplied with an H level voltage and output an L level voltage. The NMOS transistor 10 turns off. Immediately after a surge is applied, the source of a PMOS transistor (not shown) for the inverter 13 is supplied with the applied surge voltage. The gate of the PMOS transistor for the inverter 13 maintains a voltage before the surge is applied. A voltage difference between the source and the gate turns on the PMOS transistor for the inverter 13. Turning on the PMOS transistor increases a gate potential of the NMOS transistor 10 to turn on the NMOS transistor 10. The current caused by the applied surge flows through the discharge path 9 to the GND. A delay circuit including the resistor 11 and the capacitor 12 propagates the applied surge voltage. The PMOS transistor for the inverter 13 turns off. The NMOS transistor 10 turns off to terminate the discharge.

The clamp circuit 4 is not limited to the configurations as shown in FIGS. 6, 7, 8, and 9. The clamp circuit 4 may be configured not to apply the current to the discharge path 9 during a normal operation and to apply the current to the discharge path 9 when a surge is applied.

FIG. 11 shows the discharge path in the integrated circuit 80. The conventional technology uses only the discharge paths 100 and 101 in consideration for application of a surge to the RF input pad 22. According to the embodiment, the input protection circuit cells 27 and 28 contain the clamp circuits having discharge paths 200 and 201 shorter than the discharge path 101.

Similarly to the conventional technology, let us examine a case where the human body model electrostatic discharge (HBM/ESD) test applies a positive surge of 2000 V from the RF input pad to the input terminal 7 with reference to the GND. The increased paths decrease the parasitic resistance for the discharge path in the entire chip in comparison with the conventional technology that uses the clamp circuits only in the power supply cell. It is assumed that the parasitic resistance becomes 0.3 O while the conventional technology indicates 3 O.

The peak current approximates to 1.33 A. The clamp circuit 4 is assumed to operate on Vc (V). The diode itself is assumed to be so sized as to satisfy the HBM withstand voltage of 2000 V or higher and is assumed to operate on Vd (V). The voltage drops by 1.33 Rpp (V) when the parasitic resistance 3 is assumed to be Rpp (O). In total, the RF input pad is supplied with (Vc+Vd+1.33 Rpp) (V).

Let us assume that Vic is set to 11 V as a degradation start voltage for the circuit to be protected. The voltage is expressed as: Vic (=11V)>Vc+Vd+0.133 Rp (=5+2.3+0.4=7.7 V), where Vc=5 V, Vd=2.3 V, and Rpp=0.3 O. These networks do not reach the degradation start voltage for the circuit to be protected and are capable of discharging an ESD pulse current caused by the HBM test.

<Effects>

The discharge path can be increased as shown in FIG. 11 because the clamp circuit 4 is contained in the input protection circuit cell 70. The discharge path 200 can ensure the shortest distance from the GND because the clamp circuit is always available adjacently to the input pad. It is possible to use the discharge path 201 provided by the clamp circuit in the other input protection circuit. The conventional discharge paths 100 and 101 are also available. That is, it is possible to increase the discharge paths for an ESD pulse current, maintain a low impedance, and ensure the number of clamp circuits needed in the chip. Since the discharge path ensures a low impedance, it is possible to minimize the size of the diodes 1 and 2 in the input protection circuit cell 70 so that the ESD robustness is ensured. It is possible to reduce a loss in the high-frequency signal while the ESD robustness is ensured. Since the discharge path ensures a low impedance, it is possible to eliminate the serially coupled series resistor 4 and reduce a loss in the high-frequency signal.

The embodiment of the invention can be applied to RFICs for wireless LAN and the other high-frequency integrated circuits in general.

What is claimed is:
1. An integrated circuit comprising:
   a signal pin;
   an internal circuit including a high-frequency circuit; and
   an input protection circuit cell that is placed between the signal pin and the internal circuit and performs a protection operation when a signal at the signal pin is applied to the high-frequency circuit,
   wherein the input protection circuit cell includes:
   an input terminal coupled to the signal pin;
   an output terminal that is coupled to the high-frequency circuit and to the input terminal via a coupling node:
   a first diode that is provided between the coupling node and a high-voltage power supply and makes an electric current flow from the coupling node to the high-voltage power supply;
   a second diode that is provided between the coupling node and a low-voltage power supply and makes an electric current flow from the low-voltage power supply to the coupling node; and a clamp circuit that is coupled parallel to the first and second diodes between the high-voltage power supply and the low-voltage power supply, wherein the clamp circuit includes an NMOS transistor having a drain terminal coupled to the high-voltage power supply, a gate terminal and a source terminal coupled to the low-voltage power supply, and the gate terminal and the source terminal connected to each other.

2. The integrated circuit according to claim 1, comprising:

a first wiring for supplying the high-voltage power supply and having a rectangular shape with a pair of longer sides along a first direction and a pair of shorter sides along a second direction intersected with the first direction, respectively; and a second wiring for supplying the low-voltage power supply and having a rectangular shape with a pair of longer sides along the first direction and a pair of shorter sides along the second direction, respectively, wherein the output terminal, the first wiring, the second wiring and the input terminal are disposed along the second direction in turn, wherein the first diode, the first wiring, the second diode, the second wiring and the NMOS transistor are disposed along the second direction in turn.

3. An integrated circuit comprising:

a signal pin;

an internal circuit including a high-frequency circuit; and an input protection circuit cell that is placed between the signal pin and the internal circuit and performs a protection operation when a signal at the signal pin is applied to the high-frequency circuit, wherein the input protection circuit cell includes:

an input terminal coupled to the signal pin;

an output terminal that is coupled to the high-frequency circuit and to the input terminal via a coupling node;

a first diode that is provided between the coupling node and a high-voltage power supply and makes an electric current flow from the coupling node to the high-voltage power supply;

a second diode that is provided between the coupling node and a low-voltage power supply and makes an electric current flow from the low-voltage power supply to the coupling node; and a clamp circuit that is coupled parallel to the first and second diodes between the high-voltage power supply and the low-voltage power supply, wherein the clamp circuit includes:

a resistor coupled between the high-voltage power supply and a first node;

a capacitor coupled between the first node and the low-voltage power supply;

an inverter that is coupled between the first node and a second node and configures an input near the first node and an output near the second node;

an NMOS transistor having a gate terminal coupled to the second node, a drain terminal coupled to the high-voltage power supply, and a source terminal coupled to the low-voltage power supply;

a first wiring for supplying the high-voltage power supply and having a rectangular shape with a pair of longer sides along a first direction and a pair of shorter sides along a second direction intersected with the first direction, respectively; and a second wiring for supplying the low-voltage power supply and having a rectangular shape with a pair of longer sides along the first direction and a pair of shorter sides along the second direction, respectively, wherein the output terminal, the first wiring, the second wiring and the input terminal are disposed along the second direction in turn, wherein the first diode, the second diode, the resistor, the capacitor, the inverter and the NMOS transistor are disposed along the second direction in turn, wherein the first diode provided under the first wiring, wherein the inverter provided under the second wiring.

* * * * *